United States Patent [19]

Janutka

[11] Patent Number: 4,491,750

[45] Date of Patent: Jan. 1, 1985

[54] BIDIRECTIONALLY SOURCE STACKED FETS WITH DRAIN-REFERENCED COMMON GATING

[75] Inventor: William J. Janutka, West Allis, Wis.

[73] Assignee: Eaton Corporation, Cleveland, Ohio

[21] Appl. No.: 425,158

[22] Filed: Sep. 28, 1982

[51] Int. Cl.³ .................... H03K 17/08; H03K 17/10; H03K 17/687

[52] U.S. Cl. ................................. 307/577; 307/583; 307/499; 307/570; 307/585

[58] Field of Search ............... 307/241, 242, 570, 571, 307/572, 577, 582, 583, 584, 270, 304, 200 B, 499, 501, 352, 353, 579, 585; 357/23 GP; 330/269

[56] References Cited

U.S. PATENT DOCUMENTS 3,532,899 10/1970 Huth et al. ......................... 307/572

FOREIGN PATENT DOCUMENTS 2527172 1/1976 Fed. Rep. of Germany ...... 330/269
143837 11/1980 Japan ................................ 307/584
111320 9/1981 Japan ................................ 307/571

Primary Examiner—Larry N. Anagnos
Assistant Examiner—David R. Bertelson
Attorney, Agent, or Firm—Andrus, Sceales, Starke & Sawall

[57] ABSTRACT

A bidirectionally source stacked FET circuit is provided with drain-referencing of the gating circuitry, instead of source-referencing. This requisite gate to source potential to charge the gate and effect conduction of the FETs is provided by referencing the gate circuitry to a common anode point of diodes having their cathodes connected to the drains of the FETs. The common anode point is at substantially the same potential as the common source point of the FETs. The gate charging potential is provided by current from a current source through a resistor to the common anode point, which IR drop establishes the requisite gate voltage to drive the corresponding FET into conduction regardless of the polarity of first and second main terminals at respective FET drains.

8 Claims, 1 Drawing Figure

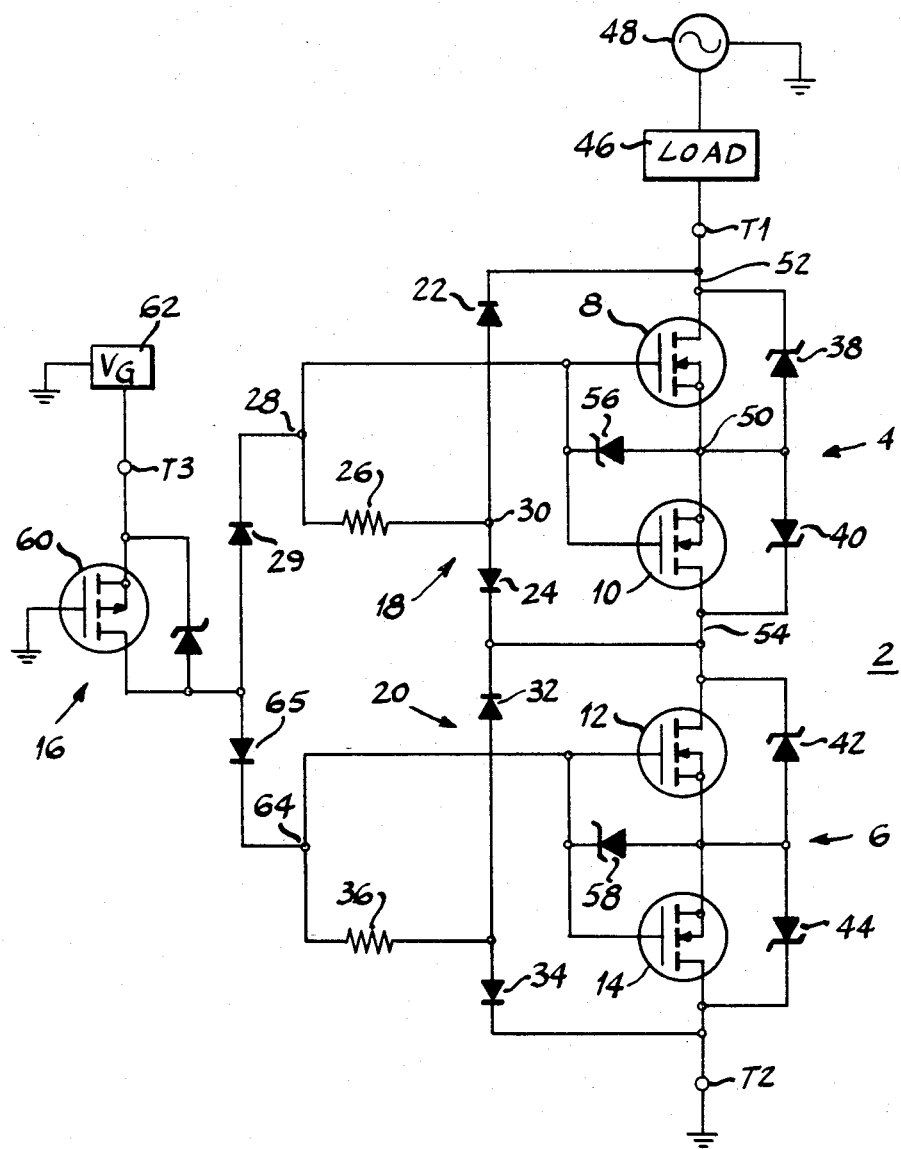

BIDIRECTIONALLY SOURCE STACKED FETS WITH DRAIN-REFERENCED COMMON GATING

BACKGROUND AND SUMMARY

The invention relates to power FETs (field effect transistors), and more particularly to a plurality of FETs stacked in series and capable of handling bidirectional current, for AC application.

Power FETs are known in the art. A FET is unidirectional and conducts current from one main terminal to another in response to gate drive on a third terminal. This three terminal arrangement is widely accepted, and is compatible with standard circuit applications.

The stacking of power FETs in unidirectional applications is also known. Stacking is the interconnection of multiple devices in configurations that result in capabilities beyond those of a single device. The stacking of mulitple power FETs in series results in higher voltage capability, and a better ratio of ON resistance to breakdown voltage. For example, connecting a pair of 100 volt devices in series results in a total voltage capability of 200 volts. The ON resistance in an individual power FET is proportional to the blocking voltage raised to the 2.6 power. Thus, doubling the blocking voltage in a single device would result in an ON resistance which is increased more than six times. Stacking of a pair of devices affords the increased voltage blocking capability but with lower ON resistance. Various problems encountered in stacking include voltage isolation, and differing gate triggering levels. Each of the gates wants to reference to a different level, but it is desirable to drive all the gates from the same source via a single gate terminal.

In order to control a load driven by an AC power source, a plural FET arrangement must be bidirectional, i.e. pass current in both directions. It is desirable that the plural FET circuit be a three terminal device which is compatible with most packaging environments.

The present invention addresses and solves the need for AC voltage capability in a series stacked plural FET arrangement. The FETs are bidirectionally stacked source to source, and have particularly simple and effective drain-referenced common gating circuitry.

A FET is driven into conduction by charging its gate to source capacitance, and thus gating circuitry is usually referenced to the FET source, not the drain. Stacking of power FETs source to source in series relation may make the FET sources difficult to access for gate referencing purposes, or may make source-referencing otherwise difficult or undesirable. The present invention is particularly beneficial where drain-referencing is needed or otherwise desirable for a plurality of power FETs stacked source to source in series.

BRIEF DESCRIPTION OF THE DRAWING

The single drawing is a circuit diagram of bidirectionally source stacked FETs drain-referenced common gating circuitry.

DETAILED DESCRIPTION

The drawing shows a three terminal bidirectional FET circuit 2 having a plurality of pairs 4 and 6 of enhancement mode power FETs connected in series between first and second main terminals T1 and T2. Additional pairs may be added as desired. Each pair comprises first and second power FETs connected source to source in series relation, for example first and second power FETs 8 and 10 of first pair 4, and first and second power FETs 12 and 14 of second pair 6. My copending Application Ser. No. 390,472, filed June 21, 1982, shows a pair of FETs connected source to source.

Current source means 16 is connected to the gates of the power FETs for driving them into conduction. The current source supplies a constant fixed level of current independent of output voltage. A plurality of resistance means such as 18 and 20 are provided, one for each power FET pair. Current source 16 is connected between a gate terminal T3 and the gates of each power FET pair, and each of the resistance means 18 and 20 is connected from a point common between the gates of its respective power FET pair to each of the drains of its respective power FET pair.

Resistance means 18 includes a first diode 22 having its cathode connected to the drain of the n channel first power FET 8 of the first pair 4. Resistance means 18 includes a second diode 24 having its cathode connected to the drain of the n channel second power FET 10 of the first pair 4. Resistance means 18 includes a resistor 26 connected at one end to the common gate point 28, and connected at the other end to a point 30 common to the anodes of diodes 22 and 24. Resistance means 20 is comparable, with first and second diodes 32 and 34 and resistor 36.

The drawing shows each of the power FETs with their inherent reverse characteristic diodes 38, 40, 42 and 44, as is known in the art. The main terminals are shown connected across a load 46, an AC power source 48 and ground. When the voltage on terminal T1 is positive with respect to terminal T2 and the device is in an ON state, current flows from terminal T1 through FET 8, through diode 40, through FET 12, through diode 44 to terminal T2. When the voltage on terminal T1 goes negative, current flows from terminal T2 through FET 14, through diode 42, through FET 10, through diode 38 to terminal T1.

When T1 is negative, the gate to source potential for charging the gate of first power FET 8 to turn it ON is the voltage across resistor 26 and diode 22. The potential at common source point 50 of the first power FET 4 is one diode drop above the potential at the drain 52 of power FET 8, namely the drop across diode 38. The potential at common anode point 30 of diodes 22 and 24 is also one junction drop above the potential at drain 52 of FET 8, namely the junction drop across diode 22. Common source point 50 and common anode point 30 are thus at substantially the same potential.

For the opposite polarity of main terminals T1 and T2, the potential on common source point 50 is one junction drop above the potential on the drain 54 of power FET 10, namely the junction drop across diode 40. The potential on common anode point 30 is also one junction drop above the potential on drain 54, namely the junction drop across diode 24. The potential on common source point 50 and common anode point 30 is thus the same for the opposite polarity of the main terminals.

The gate to source potential for each power FET 8 and 10 is the product of the current through resistor 26 from current source 16 and the resistance value of resistor 26. This IR drop to point 30 establishes the gate to source turn-on voltage because point 30 is at the same potential as point 50. This IR drop establishes the requisite gate to source voltage to drive the corresponding FET 8 or 10 into conduction regardless of the polarity of the corresponding main terminal T1 or T2. Operation of the second FET pair 6 is comparable. Zener diodes 56 and 58 provide overvoltage protection for the gates of the power FETs.

When terminal T1 is positive and the power FETs are OFF diode 29 decouples the gate circuit of power FET 4 from the gate circuit of power FET 6. When terminal T1 is negative the decoupling function is performed by diode 65.

Current source 16 preferably comprises a p-channel source follower grounded gate FET 60. The source of FET 60 is connected to gate terminal T3 which is supplied from a gating voltage source 62. The drain of FET 60 is connected through diodes 29 and 65 to common gate points 28 and 64 respectively. This arrangement provides positive voltage gating. For negative voltage gating, terminal T3 is connected to a positive voltage sufficient for gating, and the voltage at the gate of FET 60 is varied between the voltage at terminal T3 and common or ground.

Current source 16 may alternatively comprise a current mirror including for example a pair of PNP bipolar transistors connected base to base with commonly supplied emitters, the collector of one being connected to points 28 and 64, and the collector of the other being connected to the common bases and connected through a resistor to the grounded or common main terminal such as T2. This type of current mirror is known in the art. Another alternative current source 16 is a zener regulated current source including for example a PNP bipolar transistor having its collector connected to points 28 and 64, its base connected through a zener diode to a voltage supply source, its emitter connected through a resistor to the voltage supply source, and its base also connected through a resistor to the common or grounded main terminal such as T2. This type of zener regulated current source is known in the art.

It is recognized that various modifications are possible within the scope of the appended claims.

I claim:

1. A bidirectional FET circuit comprising:
   first and second enhancement mode power FETS of like channel type connected source to source in series relation between main power terminals connectable in circuit with a load and a source of potential, current conduction in one direction flowing through the series connection of the drain-source current path of said first FET and the forward biased substrate-drain PN junction of said second FET, and in the opposite direction through the series connection of the drain-source current path of said second FET and the forward biased substrate-drain PN junction of said first FET;
   current source means connected to the gates of said power FETs; and
   resistance means connected from a point common between the gates of said power FETs and to each of the drains of said power FETs.

2. A bidirectional FET circuit comprising:
   first and second enhancement mode power FETs connected source to source in series relation between main power terminals connectable in circuit with a load and a source of potential, current conduction in one direction flowing through the series connection of the drain-source current path of said first FET and the forward biased substrate-drain PN junction of said second FET, and in the opposite direction through the series connection of the drain-source current path of said second FET and the forward biased substrate-drain PN junction of said first FET;
   current source means connected to the gates of said power FETs; and
   resistance means connected from a point common between the gates of said power FETs and to each of the drains of said power FETs, and wherein said resistance means comprises:
   a first diode connected at one end to the drain of said first power FET;
   a second diode connected at one end to the drain of said second power FET; and
   a resistor connected at one end to said common gate point, and connected at the other end to a point common to the other ends of said diodes.

3. A bidirectional FET circuit comprising:
   a plurality of pairs of enhancement mode power FETs, each pair comprising first and second FETs connected source to source in series relation, said pairs connected in series between first and second main power terminals, current conduction in one direction flowing through the series connection of the drain-source current path of said first FET and the forward biased substrate-drain PN junction of said second FET, and in the opposite direction through the series connection of the drain-source current path of said second FET and the forward biased substrate-drain PN junction of said first FET;
   current source means connected between a gate terminal and the gates of each said power FET pair; and
   a plurality of resistance means, one for each said power FET pair, each resistance means connected from a point common between the gates of its respective said power FET pair to each of the drains of its respective said power FET pair.

4. The invention according to claim 3 wherein each said resistance means comprises:
   a first diode connected at one end to the drain of the first FET of its respective said power FET pair;
   a second diode connected at one end to the drain of the second FET of said respective said power FET pair; and
   a resistor connected at one end to said common gate point, and connected at the other end to a point common to the other ends of said diodes.

5. The invention according to claim 4 wherein said current source means comprises a source follower mode FET having a gate connected to the same potential level as one of said main terminals.

6. A three terminal bidirectional FET circuit comprising:
   a plurality of pairs of enhancement mode power FETs, each pair comprising first and second FETs connected source to source in series relation, said pairs connected in series between first and second main power terminals, current conduction in one direction flowing through the series connection of the drain-source current path of said first FET and the forward biased substrate-drain PN junction of said second FET, and in the opposite direction through the series connection of the drain-source current path of said second FET and the forward biased subsrate-drain PN junction of said first FET;

a plurality of pairs of diodes, one pair of diodes for each said power FET pair, each diode pair comprising first and second diodes having common anodes, the first diode having a cathode connected to the drain of the first power FET of its respective said pair, the second diode having a cathode connected to the drain of the second power FET of its respective said pair; and current source means connected to said gates of said power FETs of each said pair for driving said power FETs into conduction, said anodes of each pair of said diodes being coupled to said current source means.

7. The invention according to claim 6 comprising a plurality of resistors having one end connected to said current source means and another end connected to said common anode point of a respective said pair of diodes.

8. The invention according to claim 7 comprising a plurality of decoupling diodes each connected between said current source means and a respective said resistor, and also connected between said current source means and respective said gates of respective said power FET pairs.

* * * * *